United States Patent
Wu et al.

(10) Patent No.: US 10,397,887 B2
(45) Date of Patent: *Aug. 27, 2019

(54) BACKGROUND CRYSTAL OSCILLATOR CALIBRATION

(71) Applicant: QUALCOMM Incorporated, San Diego, CA (US)

(72) Inventors: Jie Wu, San Diego, CA (US); Daniel Fred Filipovic, Solana Beach, CA (US); Emilija Milorad Simic, San Diego, CA (US); Vishal Agarwal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 24 days.

This patent is subject to a terminal disclaimer.

(21) Appl. No.: 15/881,685

(22) Filed: Jan. 26, 2018

(65) Prior Publication Data

US 2018/0160381 A1 Jun. 7, 2018

Related U.S. Application Data

(63) Continuation of application No. 13/784,046, filed on Mar. 4, 2013, now Pat. No. 9,907,035.

(Continued)

(51) Int. Cl.
*H04B 17/00* (2015.01)
*H04W 56/00* (2009.01)
(Continued)

(52) U.S. Cl.
CPC ........... *H04W 56/00* (2013.01); *G01S 19/235* (2013.01); *H03L 1/022* (2013.01)

(58) Field of Classification Search
CPC ....... H03H 9/0547; H03H 2009/02496; H03H 9/19; H03L 1/028; H03L 1/026;
(Continued)

(56) References Cited

U.S. PATENT DOCUMENTS 2,009,457 A * 7/1935 Sloan ................... H05H 9/00 220/2.3 R
3,702,477 A 11/1972 Brown
(Continued)

FOREIGN PATENT DOCUMENTS

CN 100427965 C 10/2008
CN 102082548 A 6/2011
(Continued)

OTHER PUBLICATIONS

International Search Report and Written Opinion—PCT/US2013/048264—ISA/EPO—dated Nov. 5, 2013.
(Continued)

*Primary Examiner* — Edward F Urban
*Assistant Examiner* — Max Mathew
(74) *Attorney, Agent, or Firm* — MG-IP Law, P.C.

(57) ABSTRACT

System and method for temperature-calibration of a crystal oscillator (XO) in a mobile device. A temperature-calibration status of the XO is determined and a trigger condition related to temperature-calibration of the XO is detected. If the temperature-calibration status of the XO is not fully temperature-calibrated or if the XO has not been previously temperature-calibrated, a temperature-calibration session is initiated by an XO manager based on the condition, wherein a receiver is configured to receive signals and temperature-calibration of the XO is performed in a background mode based on the received signals. The condition based triggering ensures that the XO is temperature-calibrated prior to launch of any position based or global navigation satellite systems (GNSS) based applications on the mobile device. The trigger condition can include first use or power-on, charging, presence in an outdoor environment, variation in operating temperature, pre-specified time, and/or user input pertaining to the mobile device.

26 Claims, 3 Drawing Sheets

Related U.S. Application Data (60) Provisional application No. 61/666,307, filed on Jun. 29, 2012.

(51) Int. Cl.
  *G01S 19/23* (2010.01)
  *H03L 1/02* (2006.01)

(58) Field of Classification Search
  CPC . H03L 1/04; H03L 1/022; H03L 1/025; H03L 1/027; H03L 7/08; H03L 1/023; H03L 7/1974; H03L 7/07; H03L 7/0812; H03L 7/18
  USPC ..... 455/67.11; 342/357.62; 331/73, 74, 154, 331/158
  See application file for complete search history.

(56) References Cited

U.S. PATENT DOCUMENTS

| | | | |
|---|---|---|---|
| 5,654,718 | A | 8/1997 | Beason et al. |
| 5,875,388 | A * | 2/1999 | Daughtry, Jr. ........... H03B 5/32 |
| | | | 331/158 |
| 6,208,290 | B1 | 3/2001 | Krasner |
| 6,697,016 | B1 * | 2/2004 | Voor ................... G01S 19/235 |
| | | | 342/357.62 |
| 6,704,555 | B2 | 3/2004 | Sih et al. |
| 6,842,715 | B1 | 1/2005 | Gaal |
| 6,885,254 | B2 | 4/2005 | Kranz |
| 6,990,428 | B1 | 1/2006 | Kaiser et al. |
| 7,253,767 | B1 | 8/2007 | Junkar et al. |
| 7,459,984 | B2 | 12/2008 | Wang et al. |
| 7,586,382 | B2 | 9/2009 | Wang et al. |
| 7,592,878 | B2 | 9/2009 | Fagg et al. |
| 7,773,034 | B2 | 8/2010 | Levy |
| 8,188,917 | B2 | 5/2012 | Gronemeyer et al. |
| 9,008,719 | B2 | 4/2015 | Bakker et al. |
| 2004/0174943 | A1 | 9/2004 | Agarwal et al. |
| 2005/0048941 | A1 | 3/2005 | McBurney |
| 2008/0309424 | A1 * | 12/2008 | Shen .................... H03B 5/366 |
| | | | 331/158 |
| 2009/0073036 | A1 | 3/2009 | Huang |
| 2009/0108949 | A1 * | 4/2009 | Yan ......................... H03B 5/04 |
| | | | 331/158 |
| 2009/0195322 | A1 | 8/2009 | Yan et al. |
| 2009/0262018 | A1 | 10/2009 | Vasilyev et al. |
| 2009/0278735 | A1 * | 11/2009 | Jin ..................... G01S 19/235 |
| | | | 342/357.64 |
| 2009/0318167 | A1 | 12/2009 | Pon et al. |
| 2010/0120449 | A1 | 5/2010 | Jakorinne et al. |
| 2010/0232351 | A1 | 9/2010 | Chansarkar et al. |
| 2010/0264961 | A1 | 10/2010 | Onishi |
| 2010/0331032 | A1 | 12/2010 | Lipka |
| 2011/0068979 | A1 | 3/2011 | Waters et al. |
| 2011/0187596 | A1 | 8/2011 | Rao et al. |
| 2011/0199262 | A1 | 8/2011 | Karaoguz et al. |
| 2011/0298548 | A1 | 12/2011 | Jackson |
| 2011/0309977 | A1 | 12/2011 | Daugherty, Jr. et al. |
| 2012/0065913 | A1 * | 3/2012 | Sasaki ................... G01S 19/235 |
| | | | 702/94 |
| 2012/0100866 | A1 | 4/2012 | Grossman et al. |
| 2012/0151244 | A1 | 6/2012 | Ling et al. |
| 2013/0288610 | A1 * | 10/2013 | Toh ........................ H03G 3/042 |
| | | | 455/67.14 |
| 2014/0004800 | A1 | 1/2014 | Wu et al. |
| 2014/0004887 | A1 | 1/2014 | Farmer et al. |

FOREIGN PATENT DOCUMENTS

| | | |
|---|---|---|
| CN | 102403959 A | 4/2012 |
| EP | 1048959 A2 | 11/2000 |
| EP | 2009457 A2 | 12/2008 |
| JP | 2005070054 A | 3/2005 |
| JP | 2009222486 A | 10/2009 |
| WO | 2008068997 A1 | 6/2008 |
| WO | 2008123886 A1 | 10/2008 |
| WO | 2009081516 A1 | 7/2009 |
| WO | 2010125388 A1 | 11/2010 |

OTHER PUBLICATIONS

Partial International Search Report—PCT/US2013/048249—ISA/EPO—dated Nov. 4, 2013.

* cited by examiner

BACKGROUND CRYSTAL OSCILLATOR CALIBRATION

CROSS-REFERENCE TO RELATED APPLICATIONS

The present application for patent is a Continuation of U.S. patent application Ser. No. 13/784,046 entitled "BACKGROUND CRYSTAL OSCILLATOR CALIBRATION" filed Mar. 4, 2013, which claims the benefit of U.S. Provisional Application No. 61/666,307, entitled "GNSS BASED CRYSTAL OSCILLATOR CALIBRATION" filed Jun. 29, 2012, each of which are assigned to the assignee hereof, and expressly incorporated herein by reference in their entirety.

FIELD OF DISCLOSURE

Disclosed embodiments are directed to field calibration of a crystal oscillator (XO). More particularly, exemplary embodiments are directed to temperature-calibration of an XO performed in a background mode using assistance from one or more wireless signals of known or determinable frequency, wherein the temperature-calibration is triggered by one or more exemplary conditions, events, or mechanisms.

BACKGROUND

Global navigation satellite systems (GNSS) are well known in applications related to tracking and positioning. GNSS systems such as global positioning systems (GPS) are satellite-based systems used for pinpointing a precise location of a GNSS receiver or object capable of tracking satellite signals. With advances in GNSS technology, it is possible to locate and track movements of an object on the globe.

GNSS systems operate by configuring a GNSS satellite to transmit certain signals which may include pre-established codes. These signals are based on a GNSS time or satellite time derived from an atomic clock or satellite clock present in the satellite. The transmitted signals may include a time stamp indicating the time at which they were transmitted. A GNSS receiver, which may be integrated in a handheld device, is timed by a local clock located at the receiver end. Ideally, this local clock is synchronized to the satellite clock (also known as the GNSS time). The device comprising the GNSS receiver is configured to estimate the GNSS time based on the satellite signals in order to synchronize their local clocks to the GNSS time. Once the local clocks are accurately synchronized, the device is configured to calculate the propagation time for the satellite signals to reach the receiver, based on a difference between the time at which the signals were received, and the time at which they were transmitted. This propagation time is an indication of the distance between the satellite and the device, keeping in mind that factors such as atmospheric conditions may affect the propagation time.

In order to pinpoint the location of the device, the device performs the above process to calculate the distance to two or more other satellites (if altitude and/or local time of the device is known, the location can be determined with a total of three satellites, otherwise, a total of four satellites may be needed). Using the distances to the satellites, it is theoretically possible to "trilaterate" the position of the device.

However, practical applications diverge from theoretical expectations due to several sources of inaccuracies inherent in GNSS based positioning.

One source of inaccuracy relates to synchronization of the local clock. In modern devices comprising GNSS receivers, time is typically maintained via a temperature-compensated crystal oscillator (TCXO), to maintain the frequency stability required for GNSS operation across varying device temperatures. Even small errors in frequency may result in large positional errors in position estimation. Thus, the TCXO and/or a voltage controlled temperature compensated crystal oscillator (VCTCXO) have been used in the art to maintain nearly constant frequency across fluctuating temperature and voltage. While the TCXO and VCTCXO may also experience some fluctuation in frequency with fluctuations in temperature and voltage, the frequency variations in an XO, i.e., a crystal oscillator without such temperature or voltage compensation, is much larger. Accordingly, the XO has historically not been used because of the large frequency variations across temperature and voltage that may prolong GNSS searches or cause them to fail.

SUMMARY

Exemplary embodiments of the invention are directed to systems and methods for calibration of crystal oscillators (XO) in a background mode.

For example, an exemplary embodiment is directed to a method of temperature-calibrating a crystal oscillator (XO) in a mobile device, the method comprising: determining a temperature-calibration status of the XO, detecting a trigger condition related to temperature-calibration of the XO and if the temperature-calibration status of the XO is not fully temperature-calibrated, initiating a temperature-calibration session, wherein the temperature-calibration session comprises: receiving one or more signals based on the trigger, and temperature-calibrating the XO in a background mode based on the received signals.

Another exemplary embodiment is directed to a mobile device comprising: a crystal oscillator (XO), a receiver, and a processor. The processor is configured to: determine a temperature-calibration status of the XO, detect a trigger condition related to temperature-calibration of the XO, and if the temperature-calibration status of the XO is not fully temperature-calibrated, initiate a temperature-calibration session, wherein the temperature-calibration session comprises: enabling the receiver to receive signals based on the trigger, and temperature-calibrating the XO in a background mode based on the received signals.

Another exemplary embodiment is directed to a wireless communication system comprising: a crystal oscillator (XO), means for receiving signals, means for determining a temperature-calibration status of the XO, means for detecting a trigger condition related to temperature-calibration of the XO, and means for initiating a temperature-calibration session if the temperature-calibration status of the XO is not fully temperature-calibrated, wherein the temperature-calibration session comprises: receiving one or more signals based on the trigger, and temperature-calibrating the XO in a background mode based on the received signals.

Yet another exemplary embodiment is directed to a non-transitory computer-readable storage medium comprising code, which, when executed by a processor, causes the processor to perform operations for temperature-calibrating of a crystal oscillator (XO) in a mobile device, the non-transitory computer-readable storage medium comprising: code for determining a temperature-calibration status of the XO, code for detecting a trigger condition related to temperature-calibration of the XO, and code for initiating a temperature-calibration session if the temperature-calibration status of the XO is not fully temperature-calibrated, wherein the temperature-calibration session comprises: receiving one or more signals based on the trigger, and temperature-calibrating the XO in a background mode based on the received signals.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an", and "the", are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

While the uncompensated XO suffers from drawbacks that were previously explained, it is seen in exemplary embodiments that due to several advantageous aspects, such as low cost and small size, an uncompensated XO is a desirable candidate in modern mobile device applications. In order to overcome the problems with large frequency variation of the uncompensated XO, the XO can be calibrated, wherein calibration (and more particularly, "temperature-calibration") comprises determining a highly accurate relationship between frequency and temperature for the XO by using assistance from wireless signals of known frequency. By temperature-calibrating the XO and establishing a frequency-temperature relationship for the XO in this manner, a highly accurate frequency estimate of the XO can be obtained at any given temperature of operation, and thus, the problem of large frequency variations with temperature can be overcome or compensated for.

With temperature-calibration of the XO, it may be additionally desirable, in exemplary embodiments, to have the XO temperature-calibrated to a high degree of accuracy before applications which rely on the accuracy of the XO are launched on the device comprising the XO. In some cases, this means that it is desirable to temperature-calibrate the XO prior to launch of position based applications using assistance of wireless signals, or in some specific cases, prior to or corresponding to an imminent launch of GNSS sessions or GNSS applications. One or more exemplary embodiments are accordingly directed to temperature-calibration of the XO prior to, or based upon an imminent, launch of GNSS sessions.

Embodiments described herein may generally pertain to a crystal oscillator (XO) in a device configured for GNSS or GPS applications. More particularly, an exemplary XO is "uncompensated," which refers herein to an XO which lacks built-in temperature or voltage compensation (or in other words, an XO which comprises a lack of built-in compensation) to account for frequency variation, in contrast to the aforementioned TCXO and VCTCXO, which have temperature and/or voltage compensation on the TCXO and/or VCTCXO device. The description of embodiments may simply make reference to an XO, and it will be understood hereinafter that such a reference will pertain to an uncompensated XO, unless otherwise specified. Therefore, exemplary embodiments may be configured to overcome the problem associated with large frequency variation in the XO by temperature-calibrating the XO prior to launch of GNSS applications, or in other words, without waiting for explicit initiation field calibration following the launch of the first GNSS session. As used herein, GNSS sessions can include applications such as positioning, tracking, mapping, or other location/position based applications using wireless signals received from satellite sources or sometimes, calibrated terrestrial sources such as wireless wide area networks (WWAN), code division multiple access (CDMA), long term evolution (LTE) networks. In some embodiments, temperature-calibration of the XO prior to launch of GNSS sessions may also mean temperature-calibration of an exemplary XO as early as possible after the device comprising the XO is taken out of the box and made ready for use (e.g., by powering on the device for the first time). As will be explained below, some embodiments are also configured to perform this temperature-calibration based on exemplary triggering conditions, mechanisms, or events and in a background mode.

Before a further detailed explanation of the embodiments is undertaken, additional definitions of terms used in this disclosure will be provided. As used herein, the term "calibration," or more specifically, "temperature-calibration," pertains to a relationship between frequency and temperature (also known as a "frequency-temperature relationship" or "FT relationship" or "FT model" or "FT curve") of the XO, formulated to a high degree of accuracy, whereby the frequency of the XO can be determined from the formulated relationship at any given temperature. While in some cases, the more general term, "calibration," may be used, it will be understood that "calibration" refers to "temperature-calibration" as it pertains to the exemplary embodiments, wherein temperature-calibration generally means determination of an FT relationship or FT model for the XO. Moreover, temperature-calibration of the XO in exemplary embodiments may also be distinguished from precalibration of the XO during manufacture or in factory settings. Precalibration, factory-based calibration, or hereinafter, "factory-calibration," as used herein, pertains to calibration of the XO in factory settings before it is placed in the field or under operational conditions. Factory-calibration is limited to the frequency offset at nominal temperature. Calibrating each XO across a broad range of temperatures in the factory is time and cost prohibitive. Therefore, factory-calibration is generally insufficient for reliable operation of the device during operation or in field conditions. Therefore, embodiments are directed to field-calibration, or more specifically, temperature-calibration in the field, of the XO, which pertains to temperature-calibrating the XO during operation of the device comprising the XO, after the device has left the factory, is integrated into a mobile device, and is put in use, for example, by the end user of the mobile device. Accordingly, it will be understood that the term "calibration" as used herein, refers to field-calibration, and more specifically, temperature-calibration in the field, during operation of the device, and excludes any precalibration that may exist in the XO.

In general, an exemplary XO can be temperature-calibrated using one or more wireless signals of known frequency, wherein the wireless signals may be satellite signals (e.g., GNSS signals), or signals from a calibrated terrestrial source such as, WWAN, CDMA, etc. Frequency assistance can be derived from these wireless signals to estimate a frequency of the XO at a given temperature, and thereby the XO frequency and temperature can be correlated to form frequency-temperature samples. Using one or more such samples, it is possible to formulate a mathematical fit or relationship such as a polynomial equation which can provide with high accuracy, the frequency of the XO at any given temperature. This process of formulating the polynomial equation, for example, comprises temperature-calibration of the XO.

In this disclosure, one or more exemplary embodiments are described, which relate to temperature-calibration of an XO in a background mode and as early as possible out of the box, wherein the temperature-calibration may be performed using assistance from one or more wireless signals. Accordingly in some embodiments, one or more trigger conditions may cause the initiation of temperature-calibration of the XO in the field, The one or more conditions may relate to determining whether XO calibration, or more specifically, XO field calibration, has been previously performed and/or if the XO has been fully calibrated (e.g. precalibrated in the factory) or temperature-calibrated to desired accuracy. As used herein, the term "not fully temperature-calibrated" refers to a temperature-calibration status of an XO which has not been previously temperature-calibrated and/or not fully temperature-calibrated (in some cases, specifically with regard to temperature-calibration for position bases application). If it is determined that the XO is not fully temperature-calibrated, exemplary trigger conditions may be generated to initiate a temperature-calibration session of the XO in the field or during device operation. In some embodiments, exemplary temperature-calibration can be performed in a background mode, i.e. operations pertaining to the temperature-calibration can be initiated and carried out independently from any other application or process that may be active in the device which comprises the XO. However, as discussed herein, a background mode need not be limited to a dedicated temperature-calibration operation, but can include any mode of operation which does not specifically require an active GNSS session or GNSS based application which would possibly or potentially initiate XO temperature-calibration as a matter of course in conventional GNSS based systems. Various exemplary triggers or trigger conditions which can be generated to launch temperature-calibration to improve user experience, efficiency, and precision of GNSS sessions, will be described with regard to one or more conditions for generating the triggers, with reference to exemplary embodiments below.

As previously explained, temperature-calibration of the XO can involve the formulation of a frequency-temperature (FT) model or FT curve. The FT model can be expressed as a polynomial equation or function, wherein frequency is expressed as an $n^{th}$ degree polynomial function of temperature. At least some of the parameters or coefficients of this polynomial equation are unknown quantities for an XO and accordingly, an objective of the XO temperature-calibration can comprise determining or refining the coefficients of the FT model for the XO. Using the received wireless signals of known frequency and an associated temperature sensor, processors on the device can be configured to obtain frequency estimates for the XO from the received wireless signals and associate them with temperature to form sample points comprising frequency and temperature for the XO. With sufficient sample points, the polynomial equation (or any other pre-specified mathematical fit of the frequency and temperature for the XO) can be solved, or in other words, the unknown coefficients can be determined. In general, the number of coefficients will vary proportionally with the value of "n" or the degree of the polynomial. However, in exemplary embodiments, certain constraints can be imposed to make reasonable assumptions regarding the value of one or more coefficients, such that the number of coefficients that are unknown, and need to be determined, may be reduced. In another example, a subset of all the parameters of the polynomial equation may be known in advance, based for example on an XO data sheet and/or an XO characteristics specification from XO vendors, thereby also reducing the number of unknown coefficients to be determined. The number of sample points required for the temperature-calibration may be reduced by reducing the number of unknown coefficients, and accordingly, the process of temperature-calibration can be speeded up. Once all the unknown coefficients are determined, the temperature-calibration can be said to be completed, or the XO can be referred to as a temperature-calibrated XO. Therefore, an XO which is not fully temperature-calibrated may be an XO for which one or more coefficients are unknown, insufficiently determined or otherwise need to be determined.

Exemplary embodiments can relate to detecting trigger conditions for initiating temperature-calibration using received wireless signals, in a background mode. The following description of exemplary embodiments will generally include a description of the various triggers for initiating temperature-calibration. One or more of these triggers or trigger conditions can be detected in combination in any particular embodiment, and embodiments are not restricted detection of any single trigger condition. Moreover, the embodiments are not restricted to any single triggering condition for or particular manners of detecting or using the triggers and skilled persons may choose any manner, or combination thereof, for implementing the exemplary triggers, without departing from the scope of the disclosed embodiments. It will also be understood that while the terms "trigger" or "trigger condition" (which may be used interchangeably herein) may in some cases refer to a logical signal which may be transmitted or transferred from one logical block to another in order to initiate a temperature-calibration session, the term may also refer to a condition code or a logical state where a related condition has been satisfied. The particular meaning of the term will become apparent based on the context in which the particular embodiments are described.

Figure 1:
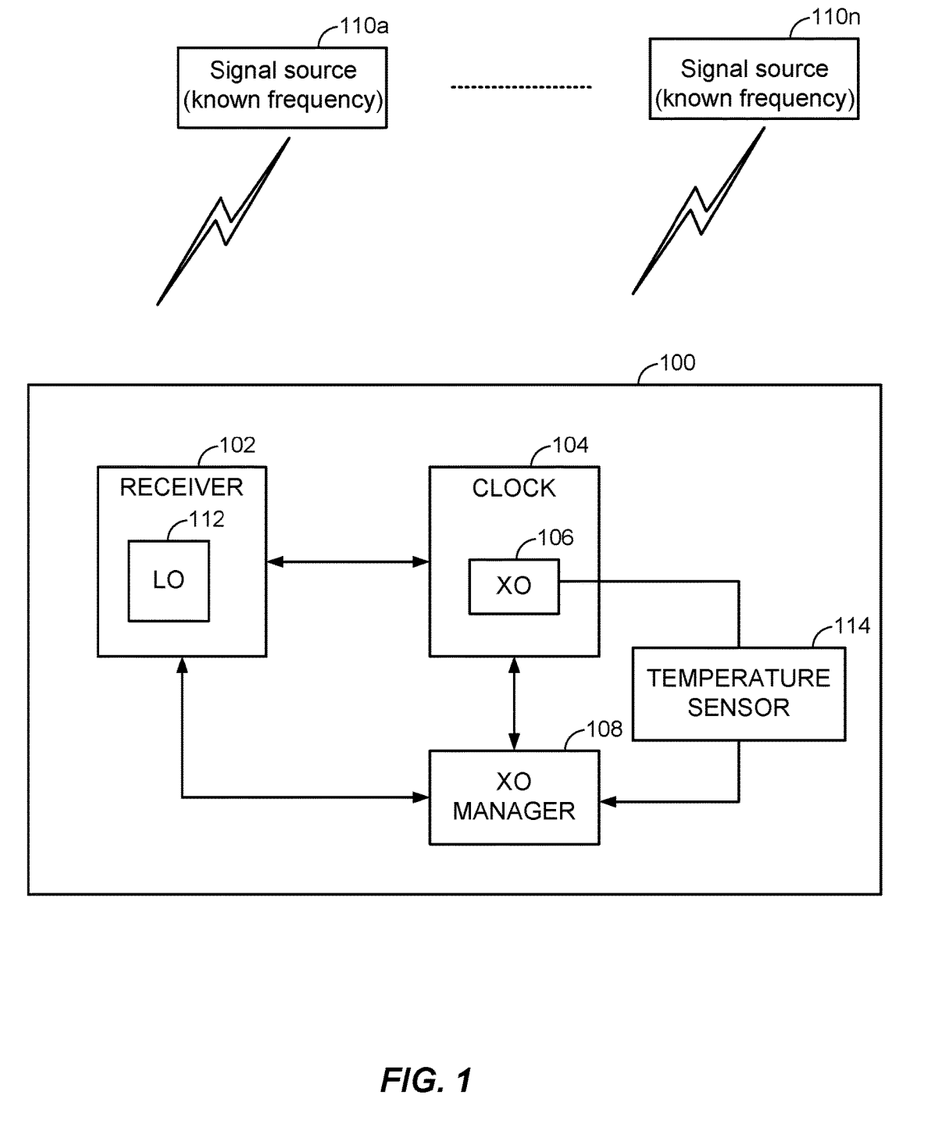
FIG. 1 illustrates a simplified schematic diagram of a device comprising a XO for field calibration using exemplary embodiments.
Figure 3:
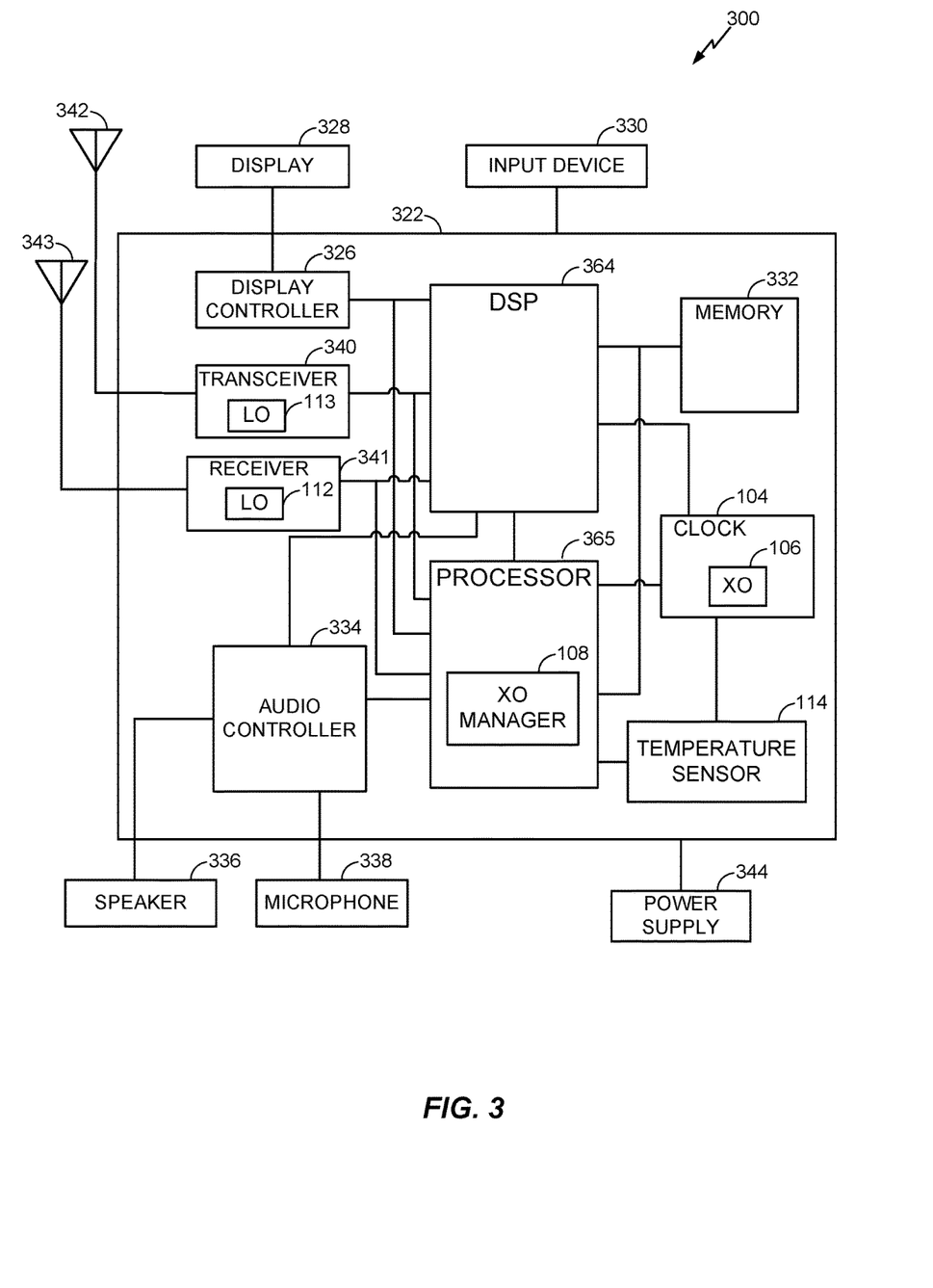
FIG. 3 illustrates an exemplary implementation of a wireless communication device configured for XO field calibration using exemplary embodiments.

With reference to FIG. 1, a simplified schematic of an exemplary device 100 configured for XO field calibration according to exemplary embodiments is illustrated. It will be noted that device 100 may pertain to a mobile device or handheld device and may further comprise one or more components as known to one skilled in the art, but which are not illustrated in FIG. 1, for the sake of clarity (although FIG. 3 provides other exemplary embodiments directed to devices similar to device 100, which illustrate certain other components which may be included in the exemplary devices). Device 100 may comprise receiver 102, which may be configured to receive wireless signals from various sources such as, one or more signal sources 110a-n. In one non-limiting example, one or more of signal sources 110a-n may be satellite or GNSS sources capable of providing GNSS fixes, including geo-stationary sources such as a satellite based augmentation system (SBAS). Additionally and optionally, one or more signal sources 110a-n may also be calibrated terrestrial sources, such as WWAN or CDMA. Receiver 102 may be driven by clock 104 which can be sourced from XO 106. Temperature sensor 114 may be included in device 100 to sense temperature of XO 106 and provide XO manager 108 with operating temperature associated with XO 106. XO manager 108 may be configured to obtain frequency estimates for XO 106 based on signals received by receiver 102. XO manager 108 may be further configured to associate operating temperatures provided by temperature sensor 114, and perform operations related to temperature-calibration of XO 106 according to the above-described techniques. While XO manager 108 is designated as a separate block in this illustration, the functionality and logic associated with XO manager 108 may be integrated in any processor, such as a digital signal processor or a general purpose processor (not explicitly shown in FIG. 1), in device 100.

In FIG. 1, one local oscillator, local oscillator 112, is illustrated as included in receiver 102. Local oscillator 112 may be sourced from XO 106, such that a frequency variation in local oscillator 112 may be proportional to frequency variation of XO 106 with temperature. In the various embodiments described herein, one or more other local oscillators may also be present in one or more other blocks. For example (as will be further described with reference to FIG. 3), an exemplary mobile device may comprise one or more receivers or transceivers configured for reception of satellite signals and one or more receivers or transceivers configured for other wireless signals such as WWAN signals. Accordingly, in some embodiments, each of those receivers and/or transceivers may have one or more local oscillators. At a given temperature, frequency of the one or more local oscillators, such as, local oscillator 112, can be compared with the frequency of received wireless signals to arrive at an estimate of frequency of XO 106, in order to generate the frequency-temperature samples required for temperature-calibration of XO 106.

In one exemplary configuration, XO manager 108 may initiate operations related to temperature-calibration or a temperature-calibration session of XO 106 based on exemplary triggers or triggering conditions. In one example, initiation of temperature-calibration of XO 106 may be triggered using one or more mechanisms or conditions which will be described in detail in the following sections. In some embodiments, logic for detecting and responding to the trigger conditions according to various triggering mechanisms, for example, based on temperature sensor 114, may be located anywhere on device 100, including within XO manager 108, although such logic is not explicitly illustrated. Skilled persons will understand various techniques for implementing and generating exemplary triggers based on the disclosure herein. Based on a received triggering condition, in one embodiment, XO manager 108 may send a command or logical signal to receiver 102 in order to inform receiver 102 to start searching for and/or receiving wireless signals, such as GNSS signals. In another embodiment, the trigger condition may be used to enable receiver 102 to commence searching/receiving functions.

The trigger conditions may be based on a condition which relates to temperature-calibration of XO 106, wherein the condition ensures that temperature-calibration of XO 106 is performed at first use of device 100, or as early as possible after device 100 is first turned on or taken out of the box, and in some cases, prior to launch of a position based or GNSS based application (i.e. an application other than the above-described process of XO calibration using GNSS signals). In some cases, the trigger condition can accordingly relate to an imminent launch of a position based application or a GNSS based application. For example, the trigger condition comprising the first use of device 100 may be detected based on an indication associated with powering on device 100. As seen in further embodiments, once XO 106 is fully or completely temperature-calibrated, the temperature-calibration status of XO 106 will be updated to reflect that XO 106 is temperature-calibrated. Thus, the status of temperature-calibration can be combined with an indication of powering on device 100 as a trigger condition related to first use for initiating temperature-calibration of XO 106, in order to ensure that subsequent power-on operations will not keep repeatedly triggering temperature-calibration if the XO is fully temperature-calibrated, by updating the status of the XO to reflect that it is completely temperature-calibrated after temperature-calibration is complete. In some embodiments which will be further described in the following sections, subsequent power-on operations can contribute to conditions related to triggering temperature-calibration, if some other criteria are met, for example, if a pre-specified time has elapsed since previous temperature-calibration of the XO or if a pre-specified frequency error in the local oscillator or XO frequency is exceeded. In one embodiment, XO manager 108 may enable temperature-calibration of XO 106 in a background mode based on a detection of the condition that device 100 is first powered on out of the box. As previously discussed, temperature-calibration of XO 106 in the background mode relates to performing operations pertaining to temperature-calibration in parallel with one or more other/unrelated processes or functions that can be performed in device 100 (for example using processing components of device 100 which are not illustrated in FIG. 1 without interfering with or depending on the operations pertaining to temperature-calibration).

In one embodiment, the condition for generating a trigger may pertain to charging of device 100. For example, a condition or state of device 100 can be detected to indicate that device 100 is turned on and is charging. In exemplary embodiments, such a state can be detected by using hardware, software, or firmware to determine that device 100 is connected to a power outlet, and this state may be utilized to trigger temperature-calibration of XO 106. In one implementation, XO manager may make the determination using input related to detection of device 100 being in a charging state and may internally generate a trigger signal. It will be recognized that this embodiment can have several beneficial aspects. For example, it will be recognized that many handheld devices are packaged and delivered to end users in an uncharged or minimally charged state. Accordingly, the users may need to first plug in or charge the device before first use as a matter of course. Triggering temperature-calibration by detecting the trigger condition that device 100 is being charged, can accordingly satisfy the condition that temperature-calibration is performed when device 100 is fresh out of the box, prior to launching, or based upon an imminent launch of a position based or GNSS based application on device 100. Additionally or alternatively, the triggering condition may satisfy the condition that the calibration status of XO 106 is not-fully temperature-calibrated (or temperature-calibration has not been previously performed for XO 106). In another advantageous aspect of this embodiment, charging device 100 can cause thermal variations or heating in device 100, which can provide several different operating temperature samples as are needed for formulation of the FT curve or calibration of XO 106. Yet another advantageous aspect of this embodiment can relate to power savings, in that, the temperature-calibration process is performed while device 100 is still plugged in, and therefore does not lead to a drain on battery resources. The related benefits may be significant because the process of temperature-calibration may require long periods of searching for and acquiring signals of sufficient strength and quality (e.g. as may be determined using threshold signal to noise (SNR) ratio criteria and error/parity checks respectively in some embodiments), which will be recognized by the skilled person as a power hungry process. Accordingly, performing such a power hungry process while device 100 is plugged in, rather than when it is being used on battery power may save on battery life.

In a related embodiment, temperature-calibration may be triggered based on conditions, or indications related to temperature or variation in temperature, while not necessarily requiring the condition that device 100 is plugged in or is in a charging state. In this embodiment, temperature of device 100, may be tracked, for example, using temperature sensor 114. When variation in temperature is detected across a period of time, a related trigger condition may be detected, for example by XO manager 108 based on inputs from temperature sensor 114. In one implementation, operating temperature may be recorded at initial conditions or at a first point in time. At a second point in time, if a comparison of the temperature provided by temperature sensor 114 with the recorded temperature reveals that the temperature has changed from the first point in time, the trigger condition may be detected once again. In addition, the triggering condition(s) may be based upon reaching or exceeding particular temperatures of XO 106. These temperatures, also known herein as "triggering temperatures" can be pre-specified, for example, to provide an optimal spread of sample points. The triggering temperatures can also be determined randomly or actively to obtain sample points at temperatures that are different from those already sampled or used in sample points. In one example, when the triggering temperature is reached, and if XO 106 is not fully temperature-calibrated, an XO temperature-calibration session may be initiated. In this manner, wireless signals may be received by receiver 102 at different sample operating temperatures and frequency estimates may be derived to form frequency-temperature samples at different operating temperatures for the process of temperature-calibration.

In another embodiment, the temperature-calibration may be triggered based on a trigger condition comprising the presence of device 100 in an outdoor location or outdoor environment or with a clear view to the sky. This embodiment relates to the availability of at least one strong received signal, such as a strong GNSS signal, from signal sources 110a-n when device 100 is outdoors or with a clear or unobstructed view to the sky. Several mechanisms related to the trigger conditions may be used in this embodiment. In a first example, the trigger condition can be based on strength of the GNSS signals received at receiver 102, for example, because strong signal strength can indicate that device 100 is present in an outdoor location, and thus can be used initiate temperature-calibration of XO 106. In a second example, the trigger condition can comprise detecting a pre-designated velocity of device 100. A speed sensor, speedometer, or accelerometer (not shown) associated with device 100 can detect whether device 100 is in motion, and moreover, an indication of high speed/velocity or whether the speed of motion is high enough to relate to those of automobiles on highways. If device 100 is detected to be in motion, based, for example, on detecting a pre-designated velocity of device 100, it may be estimated by XO manager 108 that there is a high likelihood of device 100 being located in an automobile travelling on a road or highway, and therefore being present in an outdoor location or environment with strong GNSS signals. Detecting the pre-designated velocity may also be based on Doppler measurements of the GNSS signals, because in some instances, rapidly varying Doppler values can be a characteristic of device 100 being in motion at a high velocity. In a third example, the trigger condition comprises detecting sunlight or strong sun rays incident on device 100. A light sensor (not shown) associated with device 100 may detect sunlight or strong rays incident on device 100 to estimate that device 100 is in an outdoor environment, and send a related notification to XO manager 108, which may thereby detect the trigger condition based on the notification. In a fourth example, the trigger condition can comprise pre-specified times or periodic alerts based on a local clock, such as clock 104 or any other clock associated with device 100. In this fourth example, a pre-specified time of day or night, such as 8 AM, noon, 6 PM, etc. may be used as guidelines to guess that the user of device 100 may be outdoors, for example, travelling between home and work. Alternately, a time, for example, midnight, can be used as a trigger condition to initiate a temperature-calibration session when device 100 is not in use and likely to be on a charger. Further customization may be based on a specific user's needs or personal information. In a fifth example, the trigger condition can comprise user input. The user of device 100 can input an indication, for example, through designated interfaces, ports, or other input mechanisms. The input mechanisms can include a response to a prompt or a program or application, to receive a user input which can indicate that device 100 is located outdoors or with a clear view to the sky. Regardless of the exemplary trigger conditions used for triggering calibration of XO 106, based on a high likelihood of device 100 being present in an outdoor environment or with a clear/unobstructed view of the sky, the related embodiments may beneficially contribute to efficient and fast XO calibration because if strong GNSS signals are available then the temperature-calibration process using received GNSS signals may be fast and accurate.

One or more of the above described embodiments can involve temperature-calibration in a background mode. As previously noted, temperature-calibration in a background mode can relate to temperature-calibration performed independently of position based or GNSS based applications. In some cases, device 100 can be configured to support parallel processes, wherein temperature-calibration can be carried out in a process without interfering with or depending on any other process or application being executed by device 100. In some examples, temperature-calibration can be performed based on wireless signals received from geo-stationary sources such as a single SBAS vehicle, as the SBAS signals have advantageous characteristics, such as zero Doppler, which can expedite or improve the temperature-calibration in some cases. Therefore, an exemplary trigger condition for initiating temperature-calibration of XO 106 can comprise detecting that a SBAS vehicle is within the view of or with a clear path to device 100. XO manager 108 can be alerted to initiate temperature-calibration of XO 106 based on a high confidence acquisition of the SBAS signal. Detecting that a SBAS vehicle is within clear view of device 100 can be achieved by detecting SBAS signals received, for example, at receiver 102, and measuring the strength of the received SBAS signals. Similar advantages may be obtained by a stationary device using terrestrial signals of known frequency for temperature-calibration of XO 106, such that detecting that the device is stationary, as well as, detecting strong terrestrial signals of known frequency, can be used to trigger temperature-calibration of XO 106.

In some embodiments, prior to initiating a temperature-calibration session based on one or more above-described trigger conditions, a check may be performed on the temperature-calibration status of XO 106 to ensure that XO 106 is not fully/completely temperature-calibrated or that a pre-specified time has elapsed since XO 106 was last temperature-calibrated. Thus, needless, redundant, or in some cases, conflicting operations can be avoided. Accordingly, in one implementation, a status indication or flag may be provided in XO manager 108 related to temperature-calibration status of XO 106. The status indication may be stored, for example, in a storage means such as a register (not explicitly shown), which may be situated within XO manager 108 or any other suitable storage medium. If XO 106 had been temperature-calibrated, for example, based on one or more trigger conditions, then the temperature-calibration status or temperature-calibration flag would have been updated to indicate the status as "temperature-calibrated." A subsequent or second trigger, based for example, on a subsequent or second condition related to temperature-calibration of XO 106 will be suppressed or prevented from initiating a temperature-calibration session for XO 106. On the other hand, if the temperature-calibration flag indicates that the temperature-calibration status of XO 106 is "not fully temperature-calibrated," then a second trigger condition may be detected, and a second temperature-calibration session may be initiated. In another example, the temperature-calibration flag may be accompanied by or replaced with a recorded time of previous temperature-calibration. An aspect of the recorded time of previous temperature-calibration comprises designating a pre-specified time associated with quality of temperature-calibration, such that, if the pre-specified time has elapsed since the recorded time of previous temperature-calibration, XO 106 may be treated as not fully temperature-calibrated. This aspect is based on the characteristic of mechanical structures like XO 106 to degrade in quality over time, and more specifically a characteristic of XO 106 to lose precision of temperature-calibration. Accordingly, upon each successful/complete temperature-calibration of XO 106, the time (e.g. based on any clock, such as clock 104, on device 100) at which temperature-calibration was completed may be recorded or stored in a storage means such as a register or memory. Upon detection of a trigger condition, the recorded time may be consulted, and if the pre-specified time has elapsed, the temperature-calibration status of XO 106 may be designated as not fully temperature-calibrated. The pre-specified time may be based on individual specifications of XO crystals, and may be based on information provided by the manufacturer.

In another embodiment, the temperature(s) at which temperature-calibration was performed can be recorded and temperature-calibration may be triggered only if a trigger condition is detected at a temperature different from the recorded temperature(s) or if, as noted above, a pre-specified time has elapsed since temperature-calibration may have been previously performed at the current temperature. This latter embodiment may prevent always initiating temperature-calibration at start up or power up of device 100, even when XO 106 is not fully temperature-calibrated, if the temperature at the start up is the same as the current temperature and temperature-calibration would result in needlessly duplicating existing samples.

In one example pertaining to trigger conditions based on temperature-calibration status, XO manager 108 may first clear the temperature-calibration status registers or temperature-calibration flags at an initial point in time. If a first trigger condition is detected based on device 100 being in a charging state, temperature-calibration of XO 106 is performed pursuant to this first trigger condition. Upon completion of the temperature-calibration, the stored temperature-calibration status in the temperature-calibration status registers may be updated or recorded as full/complete or "temperature-calibrated". In some embodiments, the time at which calibration was completed, may be recorded as the first temperature-calibration time, in addition to and along with, or instead of, the temperature-calibration status in the temperature-calibration status registers. If a subsequent condition is detected, for example, based on light sensors indicating that device 100 is in an outdoor environment, then XO manager 108 may consult the temperature-calibration status registers and/or the recorded time. In the case when recorded time of previous temperature-calibration is not available, the temperature-calibration status registers may indicate that XO 106 has already been temperature-calibrated, and generation of another trigger may be suppressed. In embodiments which utilize the aspect of the recorded time of previous temperature-calibration, XO manager 108 may additionally or alternatively consult the recorded time, and compare the instant time at which the condition related to device 100 being in an outdoor environment is detected, to the first temperature-calibration time. If a pre-specified time has elapsed, XO 106 may be treated as not fully temperature-calibrated, and the related trigger condition may be detected. If the pre-specified time has not elapsed, then XO 106 may be treated as temperature-calibrated, and the trigger condition may be negated or suppressed in order to avoid unnecessary and redundant re-calibration of XO 106. In some cases, XO manager 108 may be configured to proactively perform status checks, wherein if XO 106 has not been temperature-calibrated for at least the pre-specified time, or in other words, the pre-specified time has elapsed since the recorded time of previous calibration, then XO manager 108 may demote the temperature-calibration status of XO 106 to not fully temperature-calibrated. Accordingly, the temperature-calibration status of XO 106 may be based on keeping track of time elapsed from recorded time of previous temperature-calibration, and updating the temperature-calibration status to not fully temperature-calibrated, even when an intervening condition related to temperature-calibration, which would generate a trigger, has not been detected. As will be recalled from the embodiment wherein the trigger condition for initiating temperature-calibration of XO 106 is based on powering on device 100 for the first use following the first time device 100 is powered on out of the box, the temperature-calibration status registers may be cleared at those initial conditions, such that a trigger condition may be detected and temperature-calibration of XO 106 may be initiated as soon as possible after device 100 is first powered on. Once temperature-calibration is completed following the first time device 100 is powered, on, the time at which this temperature-calibration was performed can be recorded. For subsequent times that device 100 is powered on, unless the pre-specified time has elapsed, XO manager may be configured such that trigger conditions relating to powering on device 100, may themselves not be sufficient to initiate temperature-calibration or repeated temperature-calibration of XO 106. Thus, needless temperature-calibration can be avoided every time device 100 is powered on, unless the pre-specified time, indicating for example, degradation in quality of temperature-calibration of XO 106, has elapsed.

It will be appreciated that embodiments include various methods for performing the processes, functions and/or algorithms disclosed herein. For example, as illustrated in FIG. 2, an embodiment can include a method of temperature-calibration in a mobile device, the method comprising: determining a temperature-calibration status of the XO (e.g. by reading the aforementioned temperature-calibration status registers and/or recorded time of previous temperature-calibration)—Block 202; detecting a trigger condition related to temperature-calibration of the XO (e.g. conditions comprising launching a position based application or temperature-calibrating XO 106 prior to launching or based on an imminent launch of a position based application on device 100; charging device 100; varying operating temperature associated with device 100; device 100 being present in an outdoor location, based for example on detection of at least one strong GNSS signal or strong sun rays, detecting a pre-designated velocity of device 100, based for example, on Doppler measurements of GNSS signals or output from a speedometer associated with device 100, a pre-specified time associated with device 100; a user input, etc.)—Block 204; if the temperature-calibration status of the XO is not fully temperature-calibrated (e.g. based on temperature-calibration status provided in the temperature-calibration status registers and/or whether a pre-specified time has elapsed since the recorded time of previous temperature-calibration), initiating a temperature-calibration session, (e.g. using a logical signal or command from XO manager 108 to receiver 102 or condition code to enable receiver 102 or initiate reception of signals at receiver 102) wherein the temperature-calibration session comprises: receiving one or more signals based on the trigger (e.g. at receiver 102 from signal sources 110*a-n*, which may be GNSS sources, calibrated terrestrial sources such as WWAN, and/or geo-stationary sources such as SBAS sources, wherein any one or more of the signal sources may be used to generate a GNSS fix or provide GNSS time for purposes of temperature-calibrating XO 106)—Block 208; and temperature-calibrating the XO in a background mode based on the one or more received signals (e.g. performing operations related to formulating of the FT model and associated parameters related to XO 106 in a background mode of operation which does not specifically require an active GNSS session or GNSS based application which would possibly initiate temperature-calibration as a matter of course in conventional GNSS based systems)—Block 210.

With reference now to FIG. 3, another exemplary device 300 implemented as a wireless communication system is illustrated. Device 300 is similar to device 100 in many exemplary aspects, and the depiction and description of device 300 includes various additional exemplary components not shown with relation to device 100 in FIG. 1. As shown in FIG. 3, device 300 includes digital signal processor (DSP) 364 and a general purpose processor, depicted as processor 365. The above-described functions and methods related to temperature-calibration can be performed in DSP 364 or processor 365 or any combination of the processing elements thereof. Accordingly, in some embodiments, processor 365 may be configured to perform operations described with regard to XO manager 108, but it will be understood that some of the operations related to temperature-calibration can be performed in DSP 364, and moreover, these operations can be implemented in any suitable combination of hardware and software. Both DSP 364 and processor 365 may be coupled to clock 104 driven by XO 106 as previously described and to memory 332. Instructions related to related to a coder/decoder (CODEC) 334 (e.g., an audio and/or voice CODEC) can be stored in memory 332. Speaker 336 and microphone 338 can be coupled to audio controller 334, which can be coupled to processor 365 and/or to DSP 364. Display controller 326 can be coupled to DSP 364, processor 365, and to display 328. Other components, such as transceiver 340 (which may be part of a modem) and receiver 341 are also illustrated. Transceiver 340 can be coupled to wireless antenna 342, which may be configured to receive wireless signals from a calibrated terrestrial source such as WWAN, CDMA, etc. Receiver 341 can be coupled to a satellite or GNSS antenna 343, which may be configured to receive wireless signals from satellites or GNSS signals. In some embodiments, both receiver 341 and transceiver 340 may include respective local oscillators 112 and 113, which may be sourced from XO 106. Temperature sensor 114 is also illustrated, and may be coupled to clock 104 and processor 365. In a particular embodiment, DSP 364, processor 365, display controller 326, memory 332, audio controller 334, transceiver 340, receiver 341, clock 104, and temperature sensor 114 are included in a system-in-package or system-on-chip device 322.

In a particular embodiment, input device 330 and power supply 344 are coupled to the system-on-chip device 322. Moreover, in a particular embodiment, as illustrated in FIG. 3, display 328, input device 330, speaker 336, microphone 338, wireless antenna 342, GNSS antenna 343, and power supply 344 are external to the system-on-chip device 322. However, each of display 328, input device 330, speaker 336, microphone 338, wireless antenna 342, GNSS antenna 343, and power supply 344 can be coupled to a component of the system-on-chip device 322, such as an interface or a controller.

Figure 2:
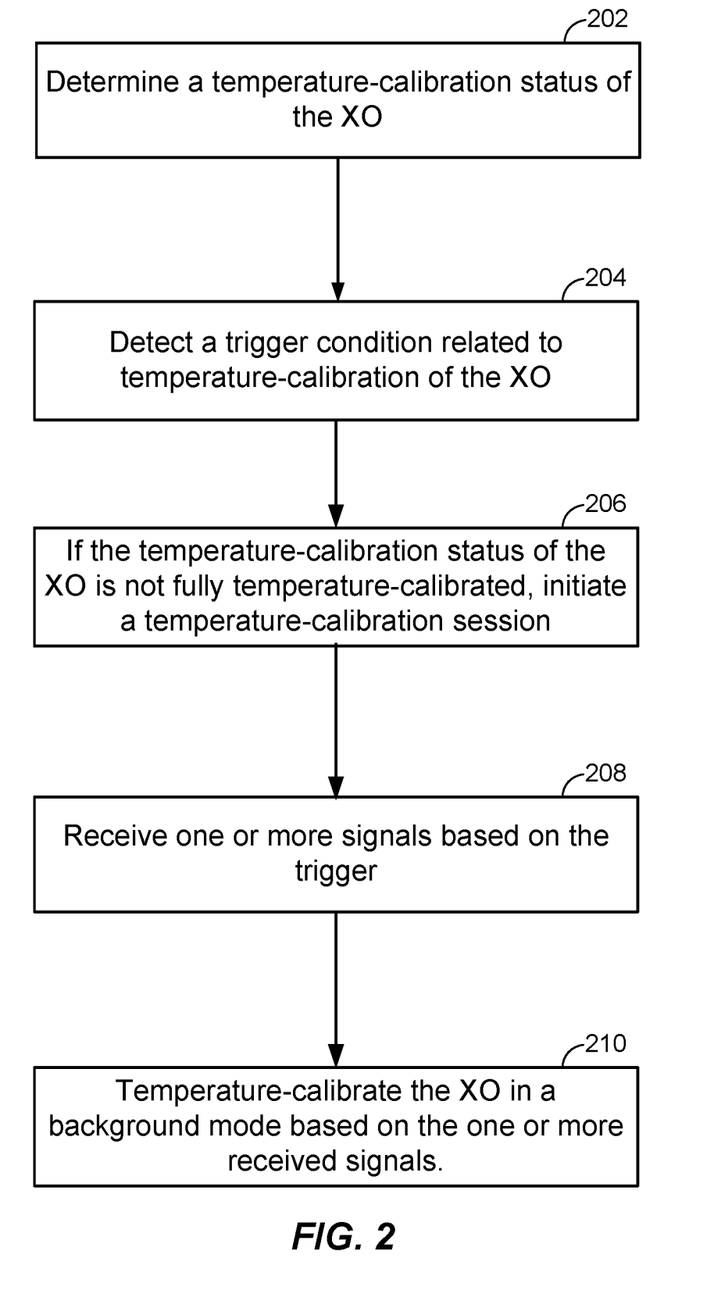
FIG. 2 illustrates a flowchart corresponding to a method of XO field calibration using exemplary embodiments.

In one embodiment, one or both of DSP 364 and processor 365, in conjunction with one or more remaining components illustrated in FIG. 3, can include logic/means to perform temperature-calibration as discussed, for example, in Blocks 202-208 of FIG. 2. For example, DSP 364 and/or processor 365 (illustrated as comprising XO manager 108), can include logic/means to implement functions related to determining a temperature-calibration status of XO 106, for example, by reading the aforementioned temperature-calibration status registers and/or recorded time of previous temperature-calibration, which may be stored in memory 332 or internally within processor 365. Further, DSP 364 and/or processor 365 in conjunction with various other components can include logic/means for detecting a trigger condition related to temperature-calibration of the XO. For example, conditions comprising launching a position based application or temperature-calibrating XO 106 when device 300 is fresh out of the box or prior to launching, or based upon an imminent launch, of a position based application on device 300 can be detected by logic/means associated with power supply 344 to indicate that XO 106 is powered on (as previously noted, this condition can be limited in some cases to the first powering on of device 300 out of the box, while subsequent powering on operations will not give rise to this condition); conditions related to charging device 300 can be detected by logic/means associated with power supply 344; conditions for detecting varying operating temperature associated with device 300 can be detected by logic/means associated with temperature sensor 114; conditions pertaining to device 300 being present in an outdoor location, can be detected by logic/means such as GNSS antenna 343 to detect at least one strong GNSS signal, or logic/means, such as a speedometer (not shown) for detecting a pre-designated velocity of device 300, or logic/means in processor 365 for measuring Doppler of GNSS signals received via receiver 341, logic/means for detecting conditions related to a pre-specified time associated with device 300, such as based on clock 104; logic/means for detecting conditions related to a user input, such as via input device 330, etc.). DSP 364 and/or processor 365 can include logic/means for determining if the temperature-calibration status of that XO 106 is not fully temperature-calibrated (e.g. based on temperature-calibration status provided in the temperature-calibration status registers stored in processor 365 or memory 332 and/or whether a pre-specified time has elapsed since the time of previous temperature-calibration recorded in a storage means within processor 365 or in memory 332). Based on the determination of the temperature-calibration status, processor 365 can comprise logic/means for initiating a temperature-calibration session (e.g., using a logical signal or command from processor 365 to receiver 341 and GNSS antenna 343 or condition code to enable receiver 341 or initiate reception of signals at GNSS antenna 343). During the temperature-calibration session, receiver 341 and/or antenna 343 can comprise logic/means for receiving one or more signals (e.g. from signal sources 110a-n, which may be GNSS sources, calibrated terrestrial sources such as WWAN, and/or geo-stationary sources such as SBAS sources, wherein any one or more of the signal sources may be used to generate a GNSS fix or provide GNSS time for purposes of temperature-calibrating XO 106). DSP 364 and/or processor 365 can comprise logic/means for temperature-calibrating XO 106 in a background mode based on the one or more received signals (e.g. performing operations related to formulating of the FT model and associated parameters related to XO 106 in a background mode of operation which does not specifically require an active GNSS session or GNSS based application which would possibly initiate temperature-calibration as a matter of course).

It should be noted that although FIG. 3 depicts a wireless communications device, DSP 364, processor 365, and memory 332 may also be integrated into a device, selected from the group consisting of a set-top box, a music player, a video player, an entertainment unit, a navigation device, a communications device, a personal digital assistant (PDA), a fixed location data unit, or a computer. Moreover, such a device may also be integrated in a semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for background temperature-calibration of a XO. Accordingly, the invention is not limited to illustrated examples and any means for performing the functionality described herein are included in embodiments of the invention.

While aspects of the above-described embodiments are generally described in relation to GNSS-based positioning systems, it will be readily appreciated how these embodiments could be modified to conform with other types of positioning systems, including but not limited to satellite positioning systems (SPSs) that do not comprise a GNSS, positioning systems that are based upon pseudolites (or pseudo-satellites, e.g., ground-based transceivers) and so on. Therefore, the embodiments described herein can be readily incorporated within non-GNSS-based systems.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

What is claimed is:

1. A method of temperature-calibrating a non-temperature compensated crystal oscillator (XO) in a mobile device, the method comprising:
   determining that a temperature-calibration status of the XO is not fully temperature-calibrated;
   detecting a trigger condition related to temperature-calibration of the XO; and
   initiating a temperature-calibration session, wherein the temperature-calibration session comprises:
     receiving wireless signals based on the trigger condition; and
     temperature-calibrating the XO in a background mode based on the received wireless signals, wherein the mobile device is configured to execute position based applications or global navigation satellite systems (GNSS) based applications, and the background mode is independent from the position based applications or global navigation satellite systems (GNSS) based applications.

2. The method of claim 1, wherein the received wireless signals comprise one or more of global navigation satellite systems (GNSS) signals, signals from a calibrated terrestrial source, or signals from a geo-stationary source.

3. The method of claim 1, wherein the trigger condition comprises one or more of:
   a first use of the mobile device, wherein the first use is associated with powering on the mobile device;
   an imminent launch of a position based application or global navigation satellite systems (GNSS) based application on the mobile device;
   charging the mobile device;
   comprises detecting presence of the mobile device in an outdoor location; or
   a variation in operating temperature of the mobile device.

4. The method of claim 1, further comprising updating the temperature-calibration status of the XO as completed, detecting a second trigger condition, and suppressing the second trigger condition based on the updated temperature-calibration status.

5. The method of claim 1, further comprising recording a first time associated with temperature-calibrating the XO, detecting a second trigger condition and if a pre-specified time has lapsed since the first time, initiating a second temperature-calibration session.

6. The method of claim 1, wherein the trigger condition comprises detecting at least one global navigation satellite systems (GNSS) signal.

7. The method of claim 6, wherein the trigger condition is further based on a signal strength of the least one GNSS signal.

8. A mobile device comprising:
   a non-temperature compensated crystal oscillator (XO);
   a receiver; and
   a processor configured to:
   determine a temperature-calibration status of the XO is not fully temperature-calibrated;
   detect a trigger condition related to temperature-calibration of the XO; and
   initiate a temperature-calibration session, wherein the temperature-calibration session comprises:
     enabling the receiver to receive wireless signals based on the trigger condition; and
     temperature-calibrating the XO in a background mode based on the received wireless signals, wherein the mobile device is configured to execute position based applications or global navigation satellite systems (GNSS) based applications, and the background mode is independent from the position based applications or global navigation satellite systems (GNSS) based applications.

9. The mobile device of claim 8, wherein the received wireless signals comprise one or more of global navigation satellite systems (GNSS) signals, signals from a calibrated terrestrial source, or signals from a geo-stationary source.

10. The mobile device of claim 8, wherein the trigger condition comprises one or more of:
    a first use of the mobile device, wherein the first use is associated with powering on the mobile device;
    an imminent launch of a position based application or global navigation satellite systems (GNSS) based application on the mobile device;
    charging the mobile device;
    comprises detecting presence of the mobile device in an outdoor location; or
    a variation in operating temperature of the mobile device.

11. The mobile device of claim 8, further comprising a status register configured to store the temperature-calibration status of the XO, wherein the processor is further configured to update the temperature-calibration status of the XO in the status register as temperature-calibrated, detect a second trigger condition, and suppress the second trigger condition based on the updated temperature-calibration status stored in the status register.

12. The mobile device of claim 8, further comprising a memory configured to store a first time associated with temperature-calibrating the XO, wherein the processor is further configured to read the first time from the memory upon detecting a second trigger condition and initiate a second temperature-calibration session if a pre-specified time has lapsed since the first time.

13. The mobile device of claim 8, integrated in at least one semiconductor die.

14. The mobile device of claim 8, integrated into a device, selected from a group consisting of a set-top box, a music player, a video player, an entertainment unit, a navigation device, a communications device, a personal digital assistant (PDA), a fixed location data unit, and a computer.

15. The mobile device of claim 8, wherein the trigger condition comprises detecting at least one global navigation satellite systems (GNSS) signal.

16. The mobile device of claim 15, wherein the trigger condition is further based on a signal strength of the least one GNSS signal.

17. A wireless communication system comprising:
a non-temperature compensated crystal oscillator (XO);
means for receiving wireless signals;
means for determining that a temperature-calibration status of the XO is not fully temperature-calibrated;
means for detecting a trigger condition related to temperature-calibration of the XO; and
means for initiating a temperature-calibration session, wherein the temperature-calibration session comprises:
enabling the means for receiving wireless signals based on the trigger condition; and
temperature-calibrating the XO in a background mode based on the received wireless signals, wherein the wireless communication system comprises means for executing position based applications or global navigation satellite systems (GNSS) based applications, and the background mode is independent from the position based applications or global navigation satellite systems (GNSS) based applications.

18. The wireless communication system of claim 17, wherein the received wireless signals comprise one or more of global navigation satellite systems (GNSS) signals, signals from a calibrated terrestrial source, or signals from a geo-stationary source.

19. The wireless communication system of claim 17, wherein the trigger condition comprises one or more of:
a first use of the wireless communication system, wherein the first use is associated with powering on the wireless communication system;
an imminent launch of a position based application or global navigation satellite systems (GNSS) based application on the wireless communication system;
charging the wireless communication system;
comprises detecting presence of the wireless communication system in an outdoor location; or
a variation in operating temperature of the wireless communication system.

20. The wireless communication system of claim 17, further comprising means for storing the temperature-calibration status of the XO, and means for suppressing a second trigger condition based on the stored temperature-calibration status.

21. The wireless communication system of claim 17, further comprising means for recording a first time associated with temperature-calibrating the XO, means for detecting a second trigger condition, and means for initiating a second temperature-calibration session if a pre-specified time has lapsed since the first time.

22. A non-transitory computer-readable storage medium comprising code, which, when executed by a processor, causes the processor to perform operations for temperature-calibrating of a non-temperature compensated crystal oscillator (XO) in a mobile device, the non-transitory computer-readable storage medium comprising:
code for determining that a temperature-calibration status of the XO is not fully temperature-calibrated;
code for detecting a trigger condition related to temperature-calibration of the XO; and
code for initiating a temperature-calibration session, wherein the temperature-calibration session comprises:
receiving wireless signals based on the trigger condition; and
temperature-calibrating the XO in a background mode based on the received wireless signals, wherein the mobile device is configured to execute position based applications or global navigation satellite systems (GNSS) based applications, and the background mode is independent from the position based applications or global navigation satellite systems (GNSS) based applications.

23. The non-transitory computer-readable storage medium of claim 22, wherein the received wireless signals comprise one or more of global navigation satellite systems (GNSS) signals, signals from a calibrated terrestrial source, or signals from a geo-stationary source.

24. The non-transitory computer-readable storage medium of claim 22, wherein the trigger condition comprises one or more of:
a first use of the mobile device, wherein the first use is associated with powering on the mobile device;
an imminent launch of a position based application or global navigation satellite systems (GNSS) based application on the mobile device;
charging the mobile device;
comprises detecting presence of the mobile device in an outdoor location; or
a variation in operating temperature of the mobile device.

25. The non-transitory computer-readable storage medium of claim 22, further comprising code for storing the temperature-calibration status of the XO, and code for suppressing a second trigger condition based on the stored temperature-calibration status.

26. The non-transitory computer-readable storage medium of claim 22, further comprising code for recording a first time associated with temperature-calibrating the XO, code for detecting a second trigger condition, and code for initiating a second temperature-calibration session if a pre-specified time has lapsed since the first time.

* * * * *